Aug. 31, 1965 A. J. SNYGG 3,204,113
CONTROL APPARATUS EMPLOYING A SEMICONDUCTOR DEVICE CONNECTED IN INVERSE PARALLEL
Filed Nov. 29, 1960
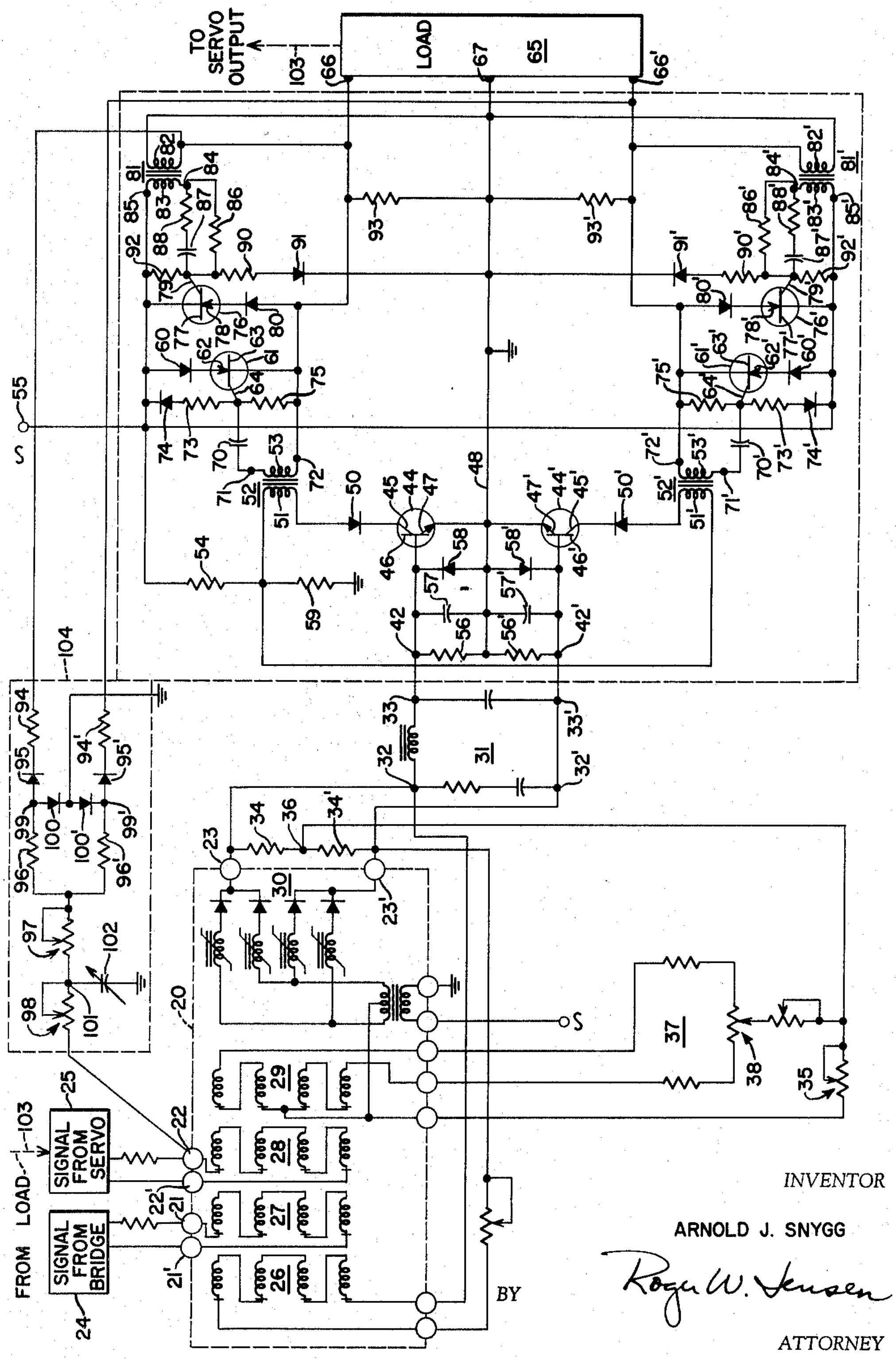
INVENTOR
ARNOLD J. SNYGG
BY Roger W. Jensen
ATTORNEY United States Patent Office 3,204,113

Patented Aug. 31, 1965

3,204,113
CONTROL APPARATUS EMPLOYING A SEMICONDUCTOR DEVICE CONNECTED IN INVERSE PARALLEL

Arnold J. Snygg, Bettendorf, Iowa, assignor to Honeywell Inc., a corporation of Delaware Filed Nov. 29, 1960, Ser. No. 72,423
6 Claims. (Cl. 307—88.5)

This invention relates in general to an improvement in semi-conductor control apparatus and more particularly to an improvement in switching circuits. It is well known in the art that when relays or thyratrons are used as switching elements, a considerable amount of radio noise is generated due to the abrupt on-off characteristics of these elements.

In this invention input signals are fed to an amplifier and the output of the amplifier is fed to a gating circuit. The amplifier and gating circuit comprise an activation or driving arrangement for two current control devices. The current control devices are connected between a source of alternating current potential source and a load. Which of the two current control devices is conducting at a particular time, is dependent upon the polarity of the output signal of the amplifier.

The current control devices comprise two silicon control rectifiers connected in parallel and poled in the opposite direction. The control electrode of the first silicon control rectifier is connected by means of a phase shifting network to the output of the gating circuit. This phase shifting network is designed so that the first silicon control rectifier is triggered as the energizing potential source changes polarity. Therefore the silicon control rectifier is switched on at a no current or at a very low current condition and thereby the radio noise is minimized. The control electrode of the second silicon control rectifier is connected through a second phase shifting network to the output of the first silicon control rectifier, so that the conduction of the second silicon control rectifier is slaved to the conduction of the first silicon control rectifier.

A negative feedback signal is coupled from the load to the input of the amplifier. This feedback signal overrides the input signal and thereby causes intermittent switching operation and provides a pulsed output to the load.

The load container is a servomechanism that feeds a rebalance signal to the amplifier input to null the amplifier when the load has been driven to the proper position.

It is one object of this invention to provide an electronic means of switching a relay type servomechanism which hitherto has been switched by electro-mechanical means.

Another object of this invention, therefore, is to provide a switching circuit wherein the amount of radio noise generated is minimized.

Another object of this invention is to provide a switching circuit utilizing a plurality of sets of electronic discharge devices wherein the second discharge device in each set is controlled by the operation of the first discharge device.

Another object of this invention is to provide a switching circuit that utilizes a feedback network to obtain an interrupted switching operation and thereby delivers a pulsed output.

These and other objects of my invention will become apparent to those skilled in the art upon consideration of the accompanying specification, claims, and drawing of which the single figure is a schematic diagram of an embodiment of this invention.

Referring to the figure there is shown a magnetic amplifier 20 having a first set of input terminals 21 and 21′, a second set of input terminals 22 and 22′, and a pair of output terminals 23 and 23′. Connected to input terminals 21 and 21′ are a first set of suitable input signals 24 such as signals from an autopilot bridge circuit. A second set of input signals 25, such as signals from an autopilot servo, are connected to input terminals 22 and 22′. Magnetic amplifier 20 has a first group of windings 26, a second group of windings 27, a third group of windings 28, a fourth group of windings 29, and a fifth group of windings 30. Winding groups 26, 27, and 28 are used to sum the signals from the autopilot bridge, the signals from the autopilot servo, and a feedback signal from the amplifier output terminals 23 and 23′, and a feedback network 104.

Winding group 29 are bias windings used to establish the quiescent operating point of the amplifier and winding group 30 are the power output windings.

Connected to the output of amplifier 20 is a filter 31 having input terminals 32 and 32′ and output terminals 33 and 33′, input terminal 32 being connected to amplifier output terminal 23 and input terminal 32′ being connected to amplifier output terminal 23′.

Connected directly across amplifier output terminals 23 and 23′ are series connected resistors 34 and 34′. A rheostat 35 is connected from a junction 36 between resistors 34 and 34′ to the power windings 30 of amplifier 20. A bias control network 37, comprising a balance potentiometer 38, is serially connected to the amplifier bias windings 29, and the combination is connected across rheostat 35. Balance potentiometer 38 is used to establish a balanced amplifier output during quiescent operation, as will be described hereinafter. Filter output terminal 33 is directly connected to a base 46 of a transistor 44. Transistor 44 further has a collector 45 and an emitter 47. Emitter 47 of transistor 44 is directly connected to a common conductor 48, in this case ground. The collector 45 of transistor 44 is connected by means of a diode 50, a primary winding 51 of a transformer 52 further having a secondary winding 53, and a resistor 54 to a source of alternating potential 55. The junction between resistor 54 and transformer primary winding 51 is connected to ground by means of a resistor 59. Base 46 of transistor 44 is further connected, by means of a parallel combination of a resistor 56, a capacitor 57 and a zener diode 58, to the common conductor 48.

Potential source 55 is connected by means of a diode 60 to an anode 62 of a current control device 61, in this case a silicon control rectifier, having a cathode 63 and a control electrode 64. Cathode 63 of silicon control rectifier 61 is directly connected to a terminal 66 of a load 65. Load 65 has a further terminal 67 which is directly connected to common conductor 48. Control electrode 64 of silicon control rectifier 61 is connected by means of a capacitor 70 to a first terminal 71 on the secondary winding 53 of transformer 52. A second terminal 72 on secondary winding 53 is directly connected to the cathode 63 of silicon control rectifier 61. Control electrode 64 is further connected by means of a resistor 73 in series with a diode 74 to the source of energizing potential 55, and by means of a resistor 75 to the cathode 63 of silicon control rectifier 61. Potential source 55 is further connected to a cathode 77 of a second silicon control rectifier 76. Silicon control rectifier 76 further has an anode 78 and a control electrode 79. Anode 78 of silicon control rectifier 76 is connected by means of a diode 80 to terminal 66 of load 65.

A primary winding 82 of a transformer 81 is directly connected across terminals 66 and 67 of load 65. Transformer 81 further has a secondary winding 83 having terminals 84 and 85.

Control electrode 79 of silicon control rectifier 76 is connected by means of a resistor 86 in parallel with a series combination of capacitor 87 and resistor 88 to terminal 84 of transformer secondary winding 83. Terminal 85 of secondary winding 83 is directly connected to cathode 77 of silicon control rectifier 76. Control electrode 79 of silicon control rectifier 76 is further connected by means of a resistor 90 in series with a diode 91 to common conductor 48, and by means of a resistor 92 to cathode 77 of silicon rectifier 76. A resistor 93 is directly connected across terminals 66 and 67 of load 65. Terminal 66 of load 65 is connected by means of a series circuit comprising resistor 94, diode 95, resistor 96 and potentiometers 97 and 98 to terminal 22 of amplifier 20. Junction 99 between diode 95 and resistor 96 is connected by means of the diode 100 to the common conductor 48. Junction 101 between potentiometers 97 and 98 is connected by means of a capacitor 102 to common conductor 48.

Load 65 is connected to the servo motor output device 25 by means of a connector 103. Load 65 develops a rebalance signal to null the amplifier when the load has been driven to the proper position and connector 103 is dotted to show the load control of the rebalance signal.

Connected to output terminal 33′ of filter 31 is a second circuit which is substantially identical to the circuit previously described and therefore the corresponding components are designated with the corresponding reference numeral primed.

*Operation*

In considering the operation of the circuit of the figure assume that initially there is no input to terminals 21 and 21′ or terminals 22 and 22′ of amplifier 20. With no inputs signals to the amplifier there will be pulsating positive D.C. signals of equal magnitude at amplifier output terminals 23 and 23′. These pulsating signals will be filtered by filter circuit 31 and will appear as substantially constant D.C. signals of equal magnitude at terminals 33 and 33′ at the output of the filter. Since the D.C. signals appearing at filter output terminals 33 and 33′ are of equal magnitude there will be zero voltage between terminals 33 and 33′ and, since the amplifier is insulated from the ground, there will be substantially zero bias from the base to emitter electrodes of transistors 44 and 44′.

With zero bias on transistors 44 and 44′, these transistors will be in a nonconducting or "off" state. With transistors 44 and 44′ in their nonconducting state there is no current flow through the primary windings 51 and 51′ of transformers 52 and 52′ and therefore there is no signal developed in the secondary windings 53 and 53′ for activating silicon control rectifiers 61 or 61′. Since the silicon control rectifiers 61 and 76 or 61′ and 76′ are nonconducting, load 65 will be deenergized.

Assume now that there is a signal from signal source 24 such that terminal 21 of amplifier 20 goes positive with respect to terminal 21′. Under this condition the output of amplifier 20 becomes unbalanced such that output terminal 23 goes positive with respect to output terminal 23′. This unbalanced voltage between output terminals 23 and 23′ is coupled through filter 31 and causes filter output terminal 33 to go positive in respect to output terminal 33′. Since filter output terminal 33 is positive with respect to terminal 33′ current will flow from terminal 33 through resistor 56 and resistor 56′ to terminal 33′. Current will also flow from terminal 42 through base 46 to emitter 47 of transistor 44, conductor 48, and diode 58′ to terminal 33′. This current flow from base 46 to emitter 47 of transistor 44 turns transistor 44 to its conducting or "on" state. The current flow through diode 58′ is thus shunted around resistor 56′. This shunting action of diode 58′ effectively doubles the current flow through base 46 to emitter 47 of transistor 44. The current flow through diode 58′ also develops a voltage across the base to emitter of transistor 44′ such that this transistor is driven further into cutoff.

When transistor 44 conducts, current flows from potential source 55 through resistor 54, primary winding 51 of transformer 52, diode 50, collector 45 to emitter 47 of transistor 44, and conductor 48 to ground. The current flow in primary winding 51 of transformer 52 induces a voltage in secondary winding 53 such that terminal 71 of secondary winding 53 is positive with respect to terminal 72. Current then flows from terminal 71 through capacitor 70 and resistor 75 to terminal 72. The current flow through resistor 75 induces a voltage across this resistor of such polarity that silicon control rectifier 61 is turned to its conducting or "on" state. Capacitor 70 in series with the secondary winding 53 of transformer 52 is used to introduce a phase shift between the voltage of potential source 55 and the activation signal for energizing silicon control rectifier 61. The phase shift is such that silicon control rectifier 61 is switched on just as potential source 55 changes from its negative to positive polarity. Since silicon control rectifier 61 is switched during a nocurrent condition there is very little radio noise generated. When silicon control rectifier 61 is on, current flows from potential source 55, through diode 60, anode 62 to cathode 63 of silicon control rectifier 61, and terminal 66 to terminal 67 of load 65 to ground, and from potential source 55, through diode 60, anode 62 to cathode 63 of SCR 61, and primary winding 82 of transformer 81 to ground.

The current flow in primary winding 82 induces a voltage in secondary winding 83 such that control electrode 79 of silicon control rectifier 76 goes positive with respect to cathode 77. Capacitor 87 in circuit with secondary winding 83 is used to develop a phase shift between the activation signal for silicon control rectifier 76 and potential source 55 such that silicon control rectifier 76 is switched to its conducting or "on" state just as potential source 55 changes from its positive to negative polarity. Again, since silicon control rectifier 76 is switched during a nocurrent condition, there is very little radio noise generated. When silicon control rectifier 76 is on, current flows from ground through load 65, diode 80, and anode 78 to cathode 77 of silicon control rectifier 66 to potential source 55.

From the above description of operation of silicon control rectifiers 61 and 76 it can be seen that there is full wave energization of load 65.

When silicon control rectifier 76 conducts, terminal 66 of load 65 goes negative with respect to ground. Current then flows from ground through diode 100′, resistor 96′, resistor 96, diode 95, and resistor 94 to terminal 66, and from ground through capacitor 102, potentiometer 97, resistor 96, diode 95, and resistor 94 to terminal 66. These current flows develop a negative charge on capacitor 102 which in time results in a negative potential at terminal 101 which is coupled through potentiometer 98 to amplifier terminal 22. This feedback signal is of the opposite polarity to the input signal at input terminal 21 and hence tends to rebalance the voltages at terminals 23 and 23′ of amplifier 20. Since amplifier output terminals 23 and 23′ are again rebalanced there is no bias on transistor 44 and this transistor returns to its nonconducting or "off" state. With transistor 44 off silicon control rectifiers 61 and 76 are again turned to their "off" state and hence the feedback signal from terminal 101 disappears. When the feedback signal disappears the amplifier output terminals 23 and 23′ again unbalances and returns transistor 44 to its conducting state. When transistor 44 again conducts, silicon control rectifiers 61 and 76 are again switched to their conducting states, and the load 65 is once more energized. This "pecking" or pulsing action of load 65 continues until the rebalance signal from the servo is large enough to cancel the sigal from the autopilot bridge and thereby rebalances the output of amplifier 20.

If the signal from the autopilot bridge 24 had been of such polarity that terminal 21′ had been positive with respect to 21, output terminal 23′ of amplifier 20 would have been positive with respect to terminal 23 and transistor 44′ would have been switched to its conducting state rather than transistor 44. The operation of this second circuit indicated by the primed numbers is substantially the same as that previously described except that the load servo is driven in the opposite direction.

It is to be understood that while I have shown specific embodiment of my invention, this is for the purpose of illustration only and that my invention is to be limited solely by the scope of the appended claims.

I claim as my invention:

1. Apparatus of the class described comprising: amplifier means having input and output terminals; first and second electronic discharge devices having input, output and control electrodes; a source of energizing potential of variable polarity; load means; means connecting said first and said second discharge devices intermediate said source of energizing potential and said load means; gating means having input and output terminals; means connecting the output terminals of said amplifier to the input terminals of said gating means; first and second transformer means each having a first and a second winding; means connecting the first winding of said first transformer intermediate the output of said gating means and said source of energizing potential; phase shifting means connecting the second winding of said first transformer to the control electrode of said first discharge device; means connecting the first winding of said second transformer to said load means so that said winding will be energized when the first discharge device energizes said load; second phase shifting means connecting said second winding of the second transformer to the control electrode of said second discharge device; and input signal means connected to the input terminals of said amplifier.

2. Apparatus of the class described comprising: means for producing an electrical signal potential; control means, said control means comprising in combination; semiconductor means having a collector electrode, a base electrode and an emitter electrode, a source of alternating signal, transformer means having first and second windings, means connecting the first winding of said transformer means intermediate said source of alternating signals and the collector electrode of said semi-conductor means, means connecting the emitter electrode of said semi-conductor means to a common conductor, a first and second discharge devices each having an input electrode, output electrode, and a control electrode, first capacitive means, means connecting said first capacitive means and the second winding of said transformer means in series relationship with the output and control electrode of said first discharge device, first diode means connecting said source of alternating signals to the input electrode of said first discharge device and being poled to present an easy current-flow path when said alternating signal source is of a first polarity, further transformer means having first and second windings, said first winding connected intermediate the output electrode of said first discharge device and said common conductor, second capacitive means, means connecting the second winding of said further transformer means and said second capacitive means in series relationship with the output and control electrodes of said second discharge device, means connecting the output electrode of said second discharge device to said source of alternating signals, load means having first and second terminals said first terminal being connected to the output electrode of said first discharge device and said second terminal being connected to said common conductor, and second diode means connected intermediate the first terminal of said load means and the input electrode of said second discharge device, said second diode means being poled to present an easy current-flow path when said alternating signal source is of a second polarity; amplifier means having an input and output; means connecting the output of said amplifier to the base electrode of the semi-conductor device of said control means; means connecting the input of said amplifier to said signal potential so that said amplifier is normally responsive to said potentials for energizing said control means in accordance therewith; and feedback means responsive to said control means for rendering said amplifier means unresponsive to said potential when said control means is energized, thereby causing intermittent operation of said control means.

3. Apparatus of the class described comprising: a source of energizing potential of variable polarity; load means; first and second electronic discharge devices connected intermediate said potential source and said load, said discharge devices further having a control electrode, said first discharge device being poled so as to present an easy current-flow path when said potential source is of a first polarity and said second discharge device being poled so as to present an easy current-flow path when said potential source is of a second polarity; first phase shifting means connected intermediate said load and said control electrode of the second discharge device, said first phase shifting means being operable in response to the conduction of said first discharge device so as to activate said second discharge device when the potential source changes from said first polarity to said second polarity; activation means having input and output terminals; a source of input signals connected to the input terminals of said activation means; second phase shifting means connected intermediate the output terminals of said activation means and the control electrode of said first discharge device, said second phase shifting means being operable in response to said activation means so as to activate said first discharge device when the potential source changes from said second polarity to said first polarity; and feedback means connected intermediate said load means and the input terminals of said activation means, said feedback means being responsive to the energization of said load means so as to override said input signals and produce intermittent energization of said load.

4. Apparatus of the class described comprising: amplifier means having input and output terminals; input signal means of variable polarity connected to the input terminals of said amplifier, said amplifier being responsive to said input signals so as to produce an output in accordance therewith; first and second current control means (each having a conductive and non-conductive state) and comprising in combination; a first controllable discharge device adapted to be connected intermediate a source of energizing potential of variable polarity and a load, for energizing said load when said potential source is of a first polarity and said discharge device is conducting, a second controllable discharge device adapted to be connected intermediate said source of energizing potential and said load for energizing said load when the potential source is of a second polarity and said second discharge device is conducting, means connecting said first discharge device in controlling relation with said second discharge device so that the conduction of said second discharge device is dependent upon the conduction of said first discharge device; and gating means connected intermediate the output terminals of said amplifier and said first and second current control means for controlling the conduction of said first discharge device of said first and second current control means and thereby control the conductive state of said first and second current control means in accordance with the polarity of said amplifier output.

5. Apparatus of the class described comprising: amplifier means having input and output terminals; input signal means of variable polarity connected to the input terminals of said amplifier, said amplifier being responsive to said input signals so as to produce an output in accordance therewith; load means; a source of energizing potential of variable polarities; a first current control means having an input terminal, an output terminal and a control terminal and comprising in combination; first and second electronic discharge devices connected intermediate said input and output terminals, said discharge devices further having a control electrode, said first discharge device being poled so as to present an easy current flow path in one direction and said second discharge device being poled so as to present an easy current flow path in the opposite direction, first phase shifting means connected intermediate the output of said first discharge device and said control electrode of the second discharge device, said first phase shifting means being operable in response to the conduction of said first discharge device so as to activate said second discharge device, second phase shifting means, means connecting said second phase shifting means from the control terminal of said first current control means to the control electrode of said first discharge device; means connecting the output terminals of said first current control means to said load means; second current control means substantially the same as said first current control means; means connecting the output terminals of said second current control means to said load means; and gating means connected to intermediate the output terminals of said amplifier and said first and second current control means for controlling the conduction of said first and second current control means in accordance with the polarity of said amplifier output.

6. Apparatus of the class described comprising: first and second electronic discharge devices having input, output, and control electrodes; a source of energizing potential of variable polarity; load means; means connecting said first and second discharge devices intermediate said potential source and said load, said first discharge device being poled so as to energize the load when the potential source is of a first polarity and said first discharge device is conducting, and said second discharge device being poled so as to energize the load when the potential source is of a second polarity and said second discharge device is conducting; amplifier means having input and output terminals, said input terminals adapted to be connected to a source of input signals; gating means having input and output terminals; means connecting the output terminals of said amplifier to the input terminals of said gating means; first and second transformer means, each having a first and second winding; means connecting the first winding of said first transformer intermediate the output of said gating means and said source of energizing potential; first capacitive means; means connecting said first capacitive means and the second winding of said first transformer means in series relationship with the output and control electrode of said first discharge device; second capacitive means; means connecting the second winding of said second transformer means and said second capacitive means in series relationship with the output and control electrodes of said second discharge device; and means connecting the first winding of said second transformer to said load means so that said winding will be energized when the first discharge device energizes said load.

References Cited by the Examiner

UNITED STATES PATENTS

| | | | |
|---|---|---|---|
| 2,169,023 | 8/39 | Dawson | 315—197 X |
| 2,283,719 | 5/42 | Bivens | 315—197 X |
| 2,314,691 | 3/43 | Dawson et al. | 315—196 X |
| 2,361,845 | 10/44 | Hutchins | 315—196 X |
| 2,420,919 | 5/47 | Undy | 315—196 X |
| 2,518,118 | 8/50 | Bivens | 315—196 X |
| 2,786,967 | 3/57 | Kuenning | 315—194 X |

GEORGE N. WESTBY, *Primary Examiner.*

RALPH G. NILSON, *Examiner.*